(12) United States Patent
Katsube et al.

(10) Patent No.: US 10,700,015 B2
(45) Date of Patent: Jun. 30, 2020

(54) ELECTRONIC CONTROL UNIT

(71) Applicant: HITACHI AUTOMOTIVE SYSTEMS, LTD., Ibaraki (JP)

(72) Inventors: Yusaku Katsube, Tokyo (JP);
Masayuki Kawabata, Ibaraki (JP);
Shoho Ishikawa, Ibaraki (JP); Kentaro Yamanaka, Ibaraki (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 0 days.

(21) Appl. No.: 16/341,068

(22) PCT Filed: Oct. 3, 2017

(86) PCT No.: PCT/JP2017/035912
§ 371 (c)(1),
(2) Date: Apr. 11, 2019

(87) PCT Pub. No.: WO2018/070296
PCT Pub. Date: Apr. 19, 2018

(65) Prior Publication Data
US 2019/0237408 A1 Aug. 1, 2019

(30) Foreign Application Priority Data
Oct. 14, 2016 (JP) .................................. 2016-202893

(51) Int. Cl.
*H01L 23/552* (2006.01)
*H01L 23/538* (2006.01)
(Continued)

(52) U.S. Cl.
CPC ........ *H01L 23/552* (2013.01); *H01L 23/4006* (2013.01); *H01L 23/5386* (2013.01);
(Continued)

(58) Field of Classification Search
CPC ..... H01L 23/552; H01L 23/4006; H05K 5/02; H05K 7/20409; H05K 7/20854
See application file for complete search history.

(56) References Cited

U.S. PATENT DOCUMENTS 5,724,234 A * 3/1998 Phelps ................. H05K 9/0026
174/357
6,320,121 B1 * 11/2001 Honeycutt ........... H05K 9/0032
174/371
(Continued)

FOREIGN PATENT DOCUMENTS

JP 55-166895 A 12/1980
JP 61-190197 U 11/1986
(Continued)

OTHER PUBLICATIONS

Radio disturbance characteristics for the protection of receivers used on board vehicles, boats, and on devices—Limits and methods of measurement, CISPR 25, 2002, International Electrotechnical Commission, Second edition Aug. 2002.
International Search Report of PCT/JP2017/035912 dated Dec. 19, 2017.
Extended European Search Report received in corresponding European Application No. 17860599.4 dated May 19, 2020.

*Primary Examiner* — Mukundbhai G Patel
(74) *Attorney, Agent, or Firm* — Mattingly & Malur, PC

(57) ABSTRACT

The electronic control unit ECU includes: a base 2 that has a bottom surface portion 7 on which a printed circuit board 3 is mounted and an opening opposed to the bottom surface portion 7; and a cover 1 that covers at least a part of the bottom surface portion 7 and is engaged with the base 2. Here, the cover 1 includes an overlap portion 5 that is spaced apart from and opposed to a side surface 11 of the base 2, and the overlap portion 5 includes a slit 15.

9 Claims, 11 Drawing Sheets

(51) Int. Cl.
  *H01L 23/40*   (2006.01)
  *H05K 7/20*    (2006.01)
  *H01L 25/065*  (2006.01)
  *H05K 5/02*    (2006.01)
  *H05K 9/00*    (2006.01)
  *B60R 16/023*  (2006.01)

(52) U.S. Cl.
  CPC ........... *H01L 25/0655* (2013.01); *H05K 5/02* (2013.01); *H05K 7/20409* (2013.01); *H05K 7/20854* (2013.01); *H05K 9/00* (2013.01); *B60R 16/023* (2013.01); *H01L 2023/4062* (2013.01); *H01L 2023/4087* (2013.01)

(56) References Cited

U.S. PATENT DOCUMENTS

| | | | |
|---|---|---|---|
| 8,149,594 B2* | 4/2012 | Nishihata | H05K 9/002 174/250 |
| 2005/0118868 A1 | 6/2005 | Nagashima | |
| 2013/0322021 A1 | 12/2013 | Ohoka et al. | |

FOREIGN PATENT DOCUMENTS

| | | |
|---|---|---|
| JP | 2001-077575 A | 3/2001 |
| JP | 2006-210742 A | 8/2006 |
| JP | 2013-251433 A | 12/2013 |

* cited by examiner

[FIG. 1]
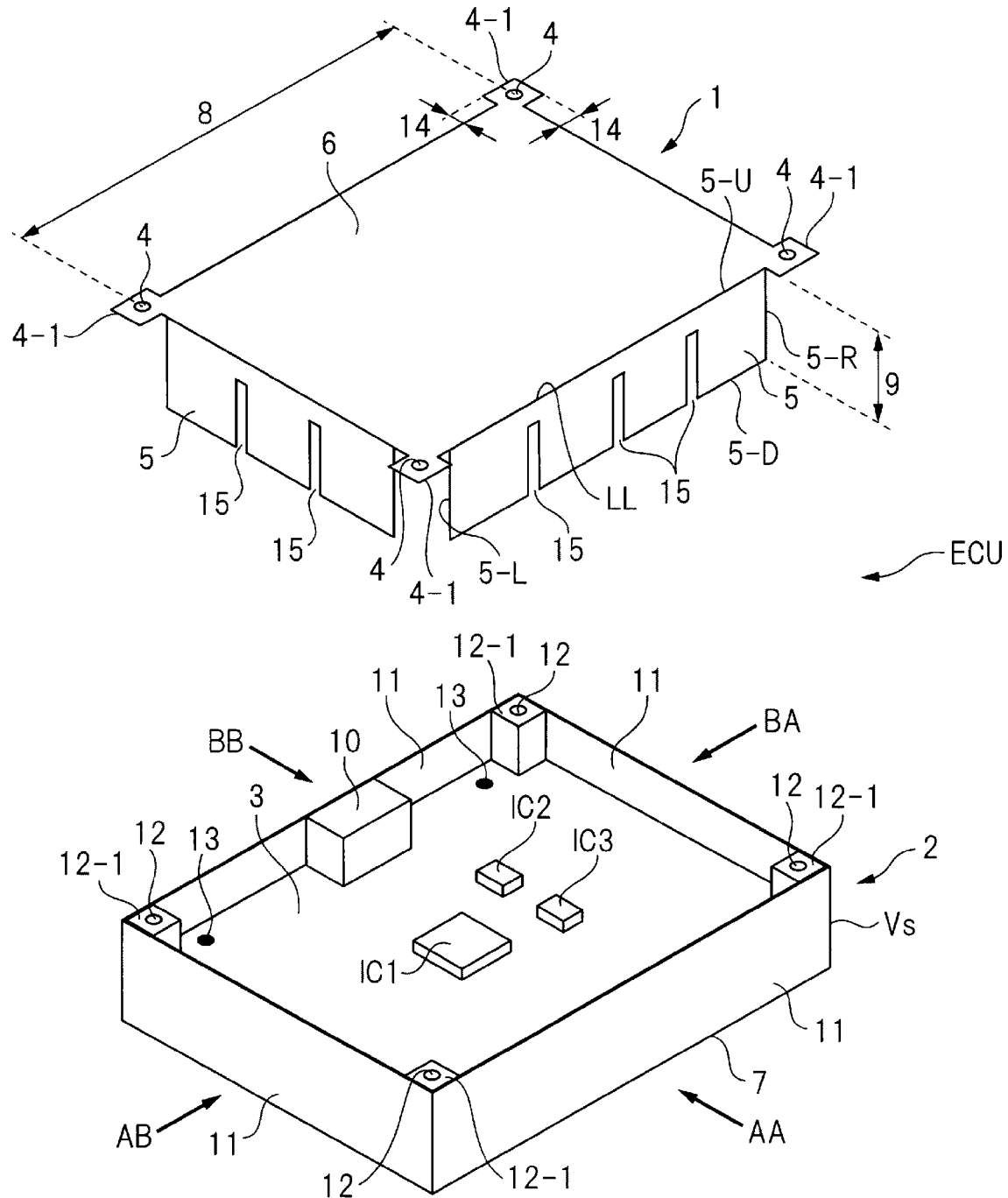

[FIG. 2]
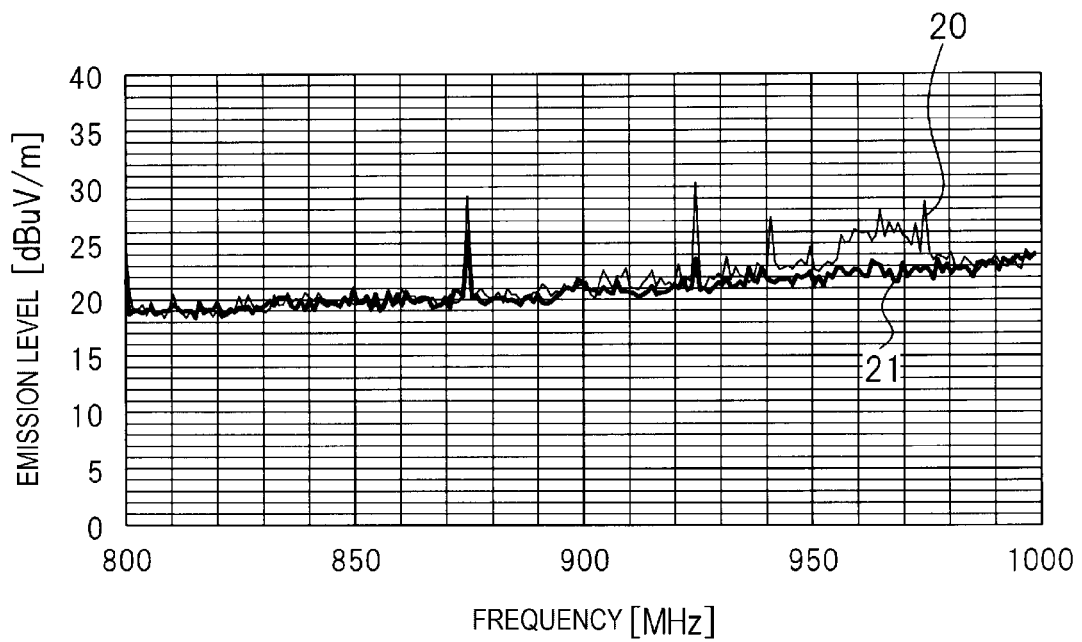

[FIG. 3]
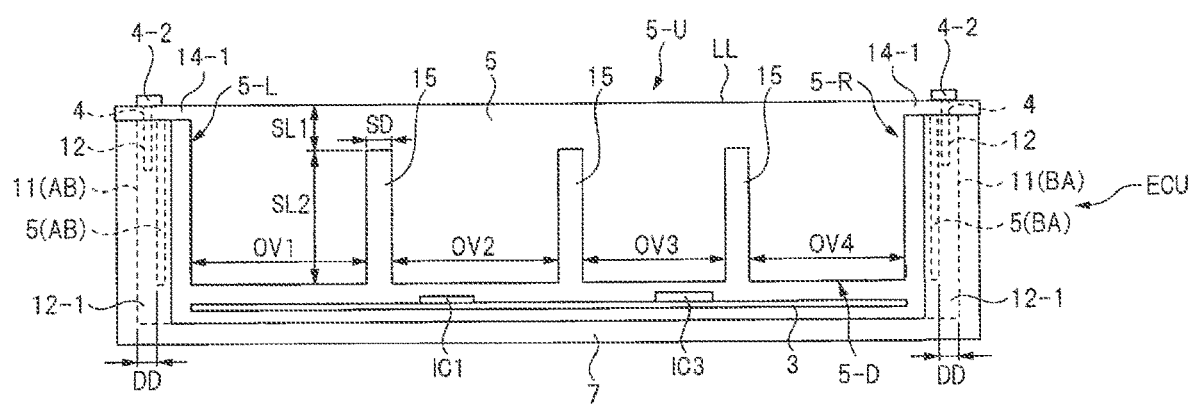

[FIG. 4]
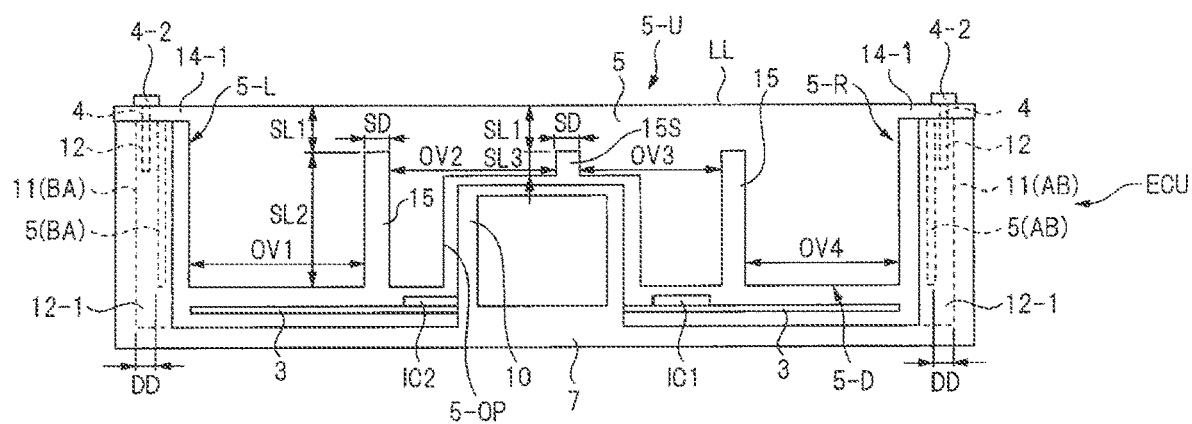

[FIG. 5]
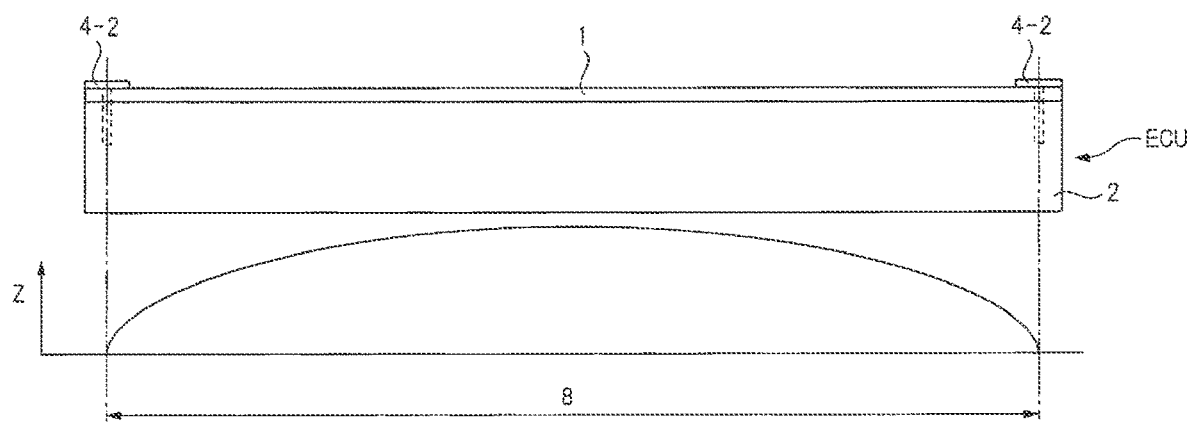

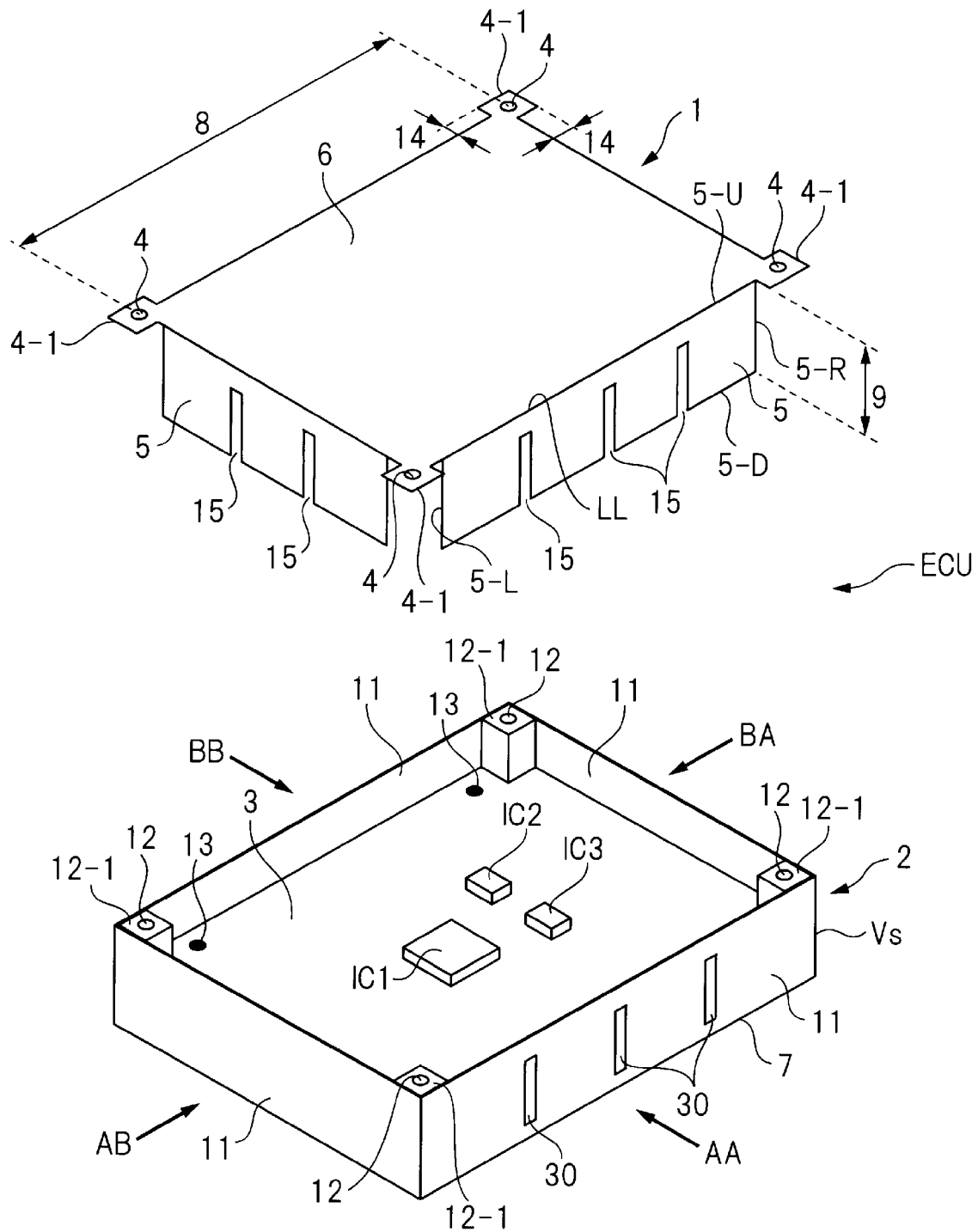
[FIG. 6]

[FIG. 7]
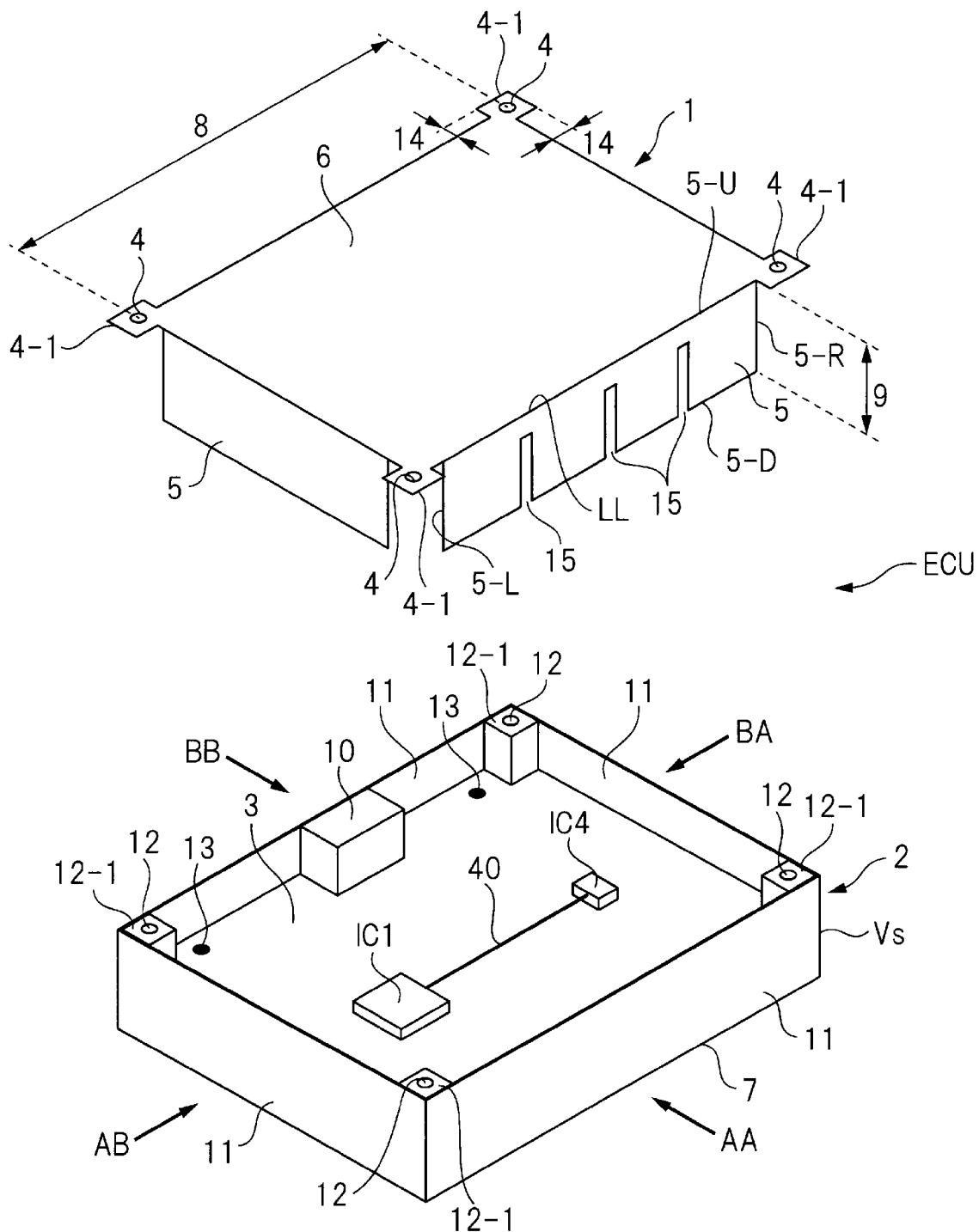

[FIG. 8]
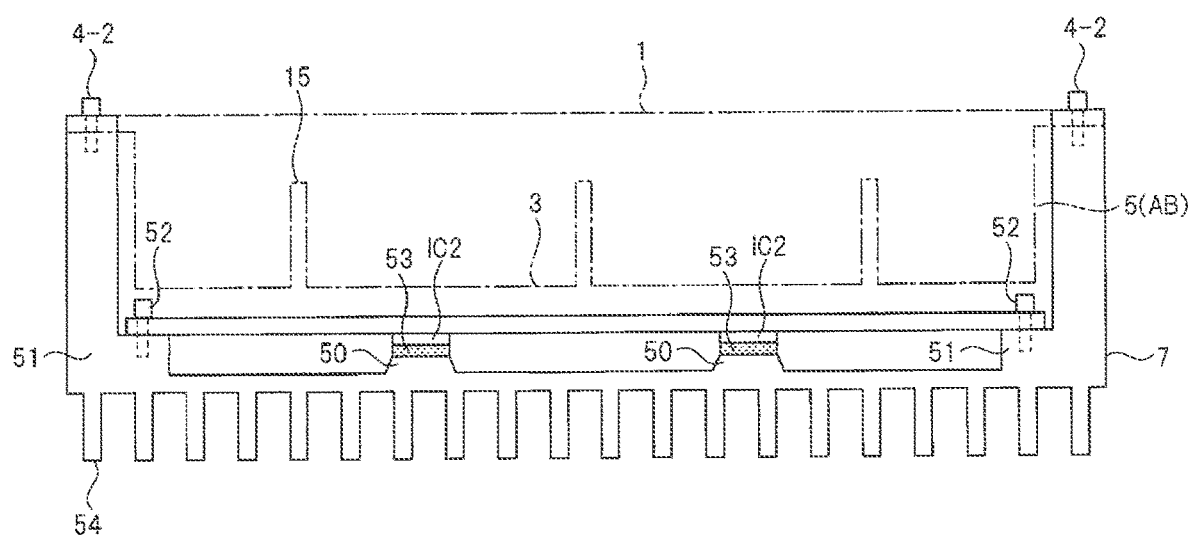

[FIG. 9]
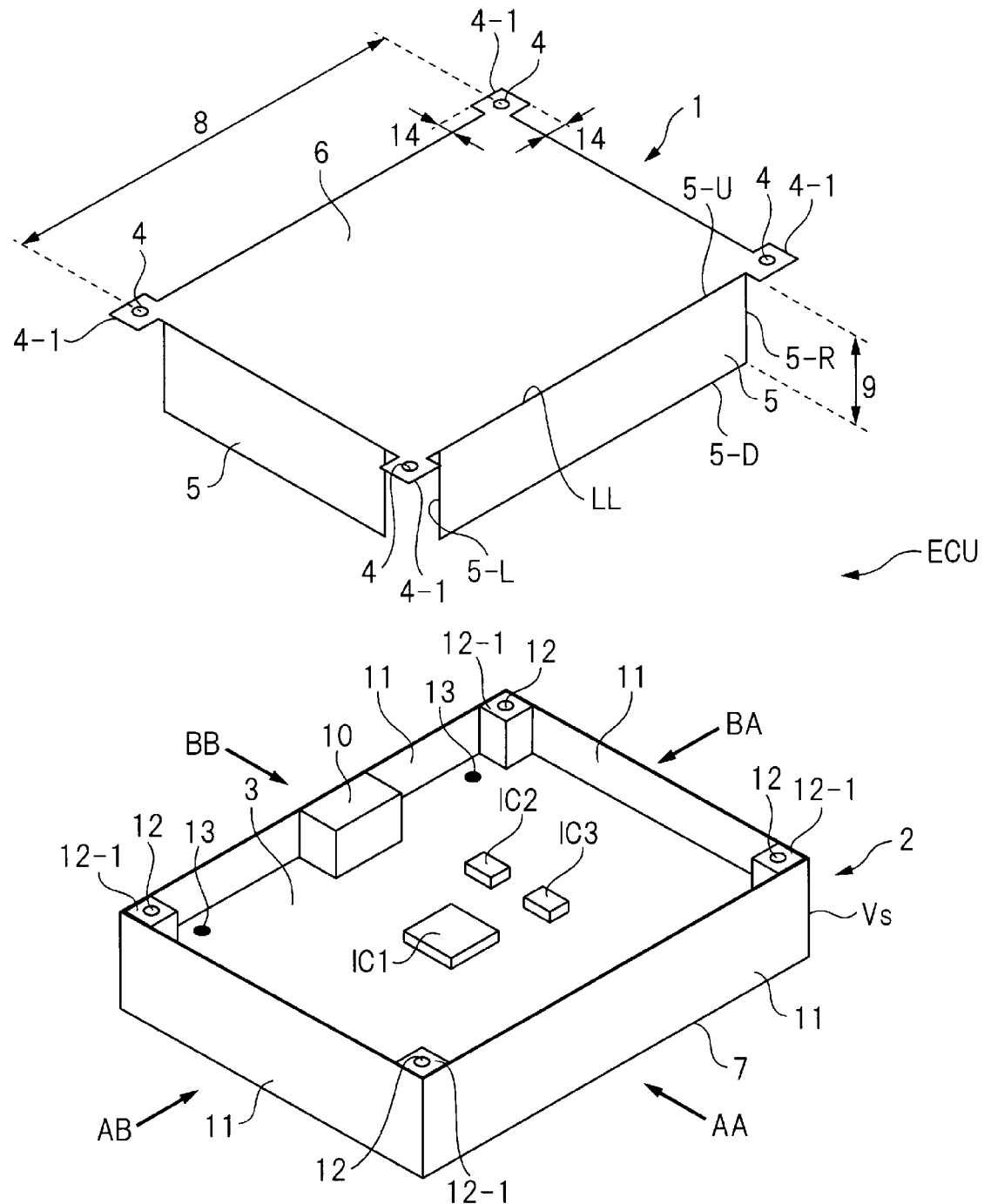

[FIG. 10]
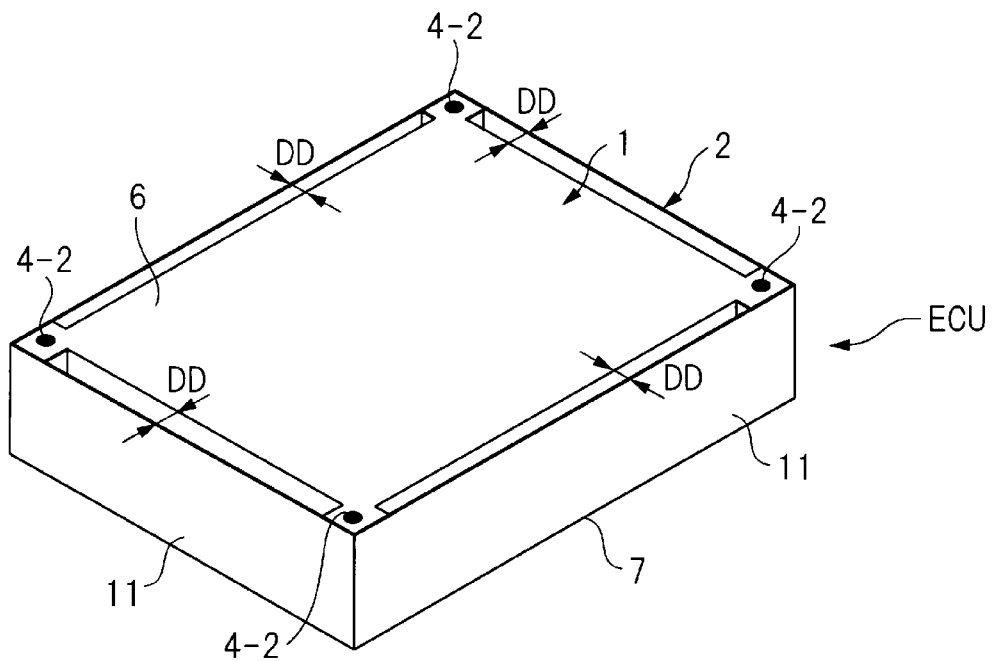

[FIG. 11]
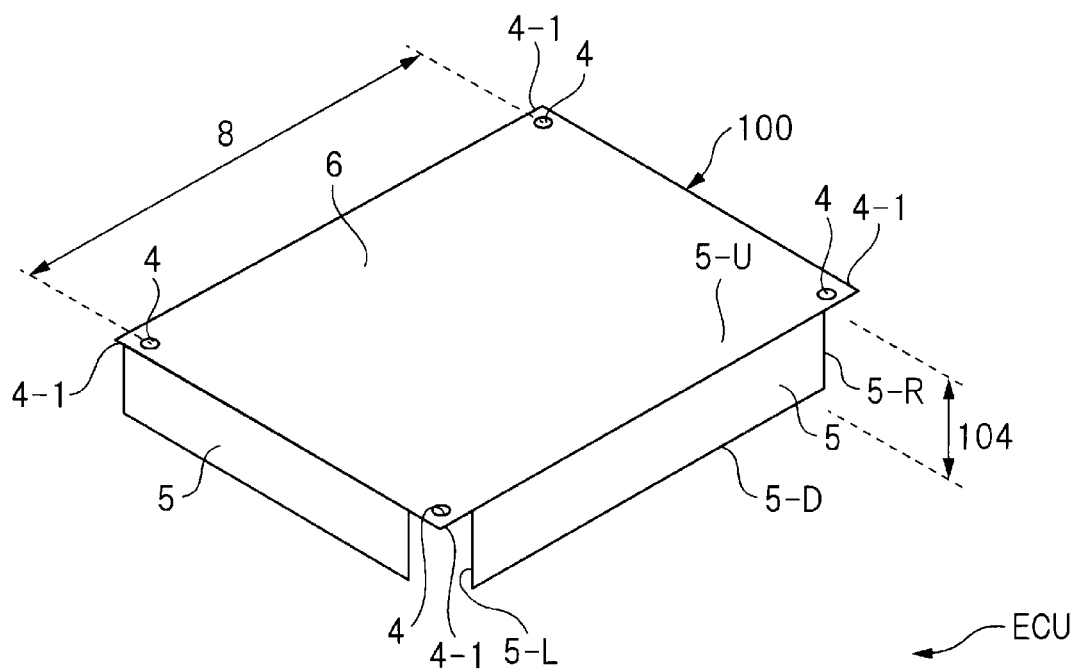
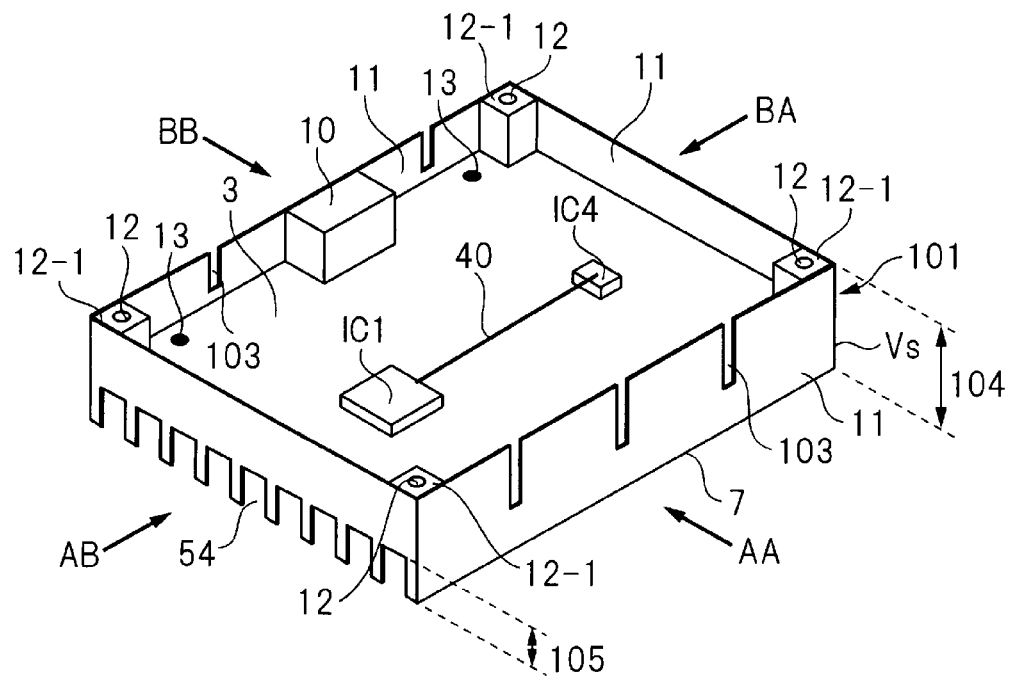

ELECTRONIC CONTROL UNIT

TECHNICAL FIELD

The present invention relates to an electronic control unit including a printed circuit board on which a semiconductor device is mounted, and particularly to an electronic control unit including a printed circuit board accommodated therein.

BACKGROUND ART

As an electronic control unit, there is known an electronic control unit including a printed circuit board (hereinafter, also simply referred to as a board) on which a semiconductor device is mounted for an automobile, a construction machine and the like. The semiconductor device mounted on the board is connected to an electronic component such as another semiconductor device by a wiring pattern formed on the board. Operation of the semiconductor device generates an operation current, and unwanted emission noise is generated from the semiconductor device and/or the wiring pattern due to the operation current. That is, the unwanted emission noise is generated from the board.

The emission noise is desired to be low so as not to affect other equipment, and an allowable level of emission noise is standardized by Comite International Special des Perturbations Radioelectriques (CISPR) that is a special committee of International Electrotechnical Commission (IEC). For example, an allowable level of emission noise from a component module mounted in an automobile is specified for a frequency up to 960 MHz in Non-Patent Document 1.

In order to reduce the emission noise from the board, a technique using a shield case that covers the board is used. In this case, the board is, for example, accommodated in the shield case and is provided as an electronic control unit. In the technique using the shield case, a resonance phenomenon occurs at a specific frequency (resonance frequency) depending on the size of the shield case. Therefore, shielding performance is lowered at the resonance frequency, and the emission noise from the shield case to outside may become large.

Patent Document 1 discloses a notch that is provided along a ridgeline of an upper surface and a side surface of the shield case so that the emission noise from the board and the resonance frequency of the shield case do not coincide.

PRIOR ART LITERATURE

Patent Literature

PTL 1: JP-A-2006-210742

Non-Patent Literature

NPTL 1: CISPR25 2002 (Second Edition)

SUMMARY OF INVENTION

Technical Problem

An electronic control unit mounted in an automobile or the like is required to have a structure that withstands vibration of a vehicle body and does not generate abnormal noise even when the vehicle body vibrates. In addition, in order to mount (accommodate) a board, a part of the shield case is required to be a removable structure. For example, the shield case includes a base having a bottom surface and side surfaces, and a cover serving as a ceiling portion. After the board is mounted in the base, the base and the cover are fastened with screws to maintain strength.

In this case, if processing accuracy or the strength of the shield case is insufficient, it is concerned that the base and/or the cover are deflected due to influence of the vibration, and places where the base and the cover are close to each other excluding portions fastened by the screws collide to generate abnormal noise.

In order to eliminate this concern, it is conceivable to increase the processing accuracy and the strength. Alternatively, it is conceivable that a distance between the base and the cover excluding the screw fastened portions is increased so that the base and the cover do not collide even if vibration occurs. When the former idea is adopted, cost is increased. When the latter idea is adopted, a new problem occurs that emission noise leaks from a gap provided between the base and the cover.

In the case of the latter idea, in order to reduce leakage of the emission noise from the gap, it is also conceivable to provide a structure in which the cover is provided with overlap portions opposing the side surfaces of the base after assembling. However, the overlap portions also generate a resonance phenomenon at a frequency (resonance frequency) depending on the size thereof. That is, the emission noise leaked to outside of the shield case may become large at the resonance frequency of the overlap portions. In this case, the emission noise from the board and the resonance frequency of the overlap portions can be prevented from being coincident with each other by increasing the number of the screw fastened portions (number of screws). However, cost increases since expense on the screws increases and assembling time on screw fastening becomes longer.

Patent Document 1 does not recognize that the abnormal noise is generated from the shield case due to the influence of the vibration or the like.

An object of the present invention is to provide an electronic control unit capable of reducing emission noise at low cost.

The above and other objects and novel features of the present invention will become apparent from the description of this specification and the accompanying drawings.

Solution to Problem

A typical one of the invention disclosed in the present application will be briefly described as follows.

In one embodiment, an electronic control unit includes: a case body that has a first surface on which a board is mounted and an opening opposed to the first surface; and a cover that covers at least a part of the first surface and is engaged with the case body. The cover includes an overlap portion that is spaced apart from and opposed to a side surface of the case body, and the overlap portion includes a slit.

Advantageous Effect

Effects obtained by the typical one of the invention disclosed in the present application will be briefly described as follows.

The electronic control unit capable of reducing emission noise at low cost can be provided.

BRIEF DESCRIPTION OF DRAWINGS

FIG. 1 is a perspective view illustrating a structure of an electronic control unit according to a first embodiment.

FIG. 2 is a characteristic diagram showing noise emission characteristics.

FIG. 3 is a cross-sectional view illustrating the structure of the electronic control unit according to the first embodiment.

FIG. 4 is a cross-sectional view illustrating the structure of the electronic control unit according to the first embodiment.

FIG. 5 is a diagram showing an operation of the electronic control unit according to the first embodiment.

FIG. 6 is a perspective view illustrating a structure of an electronic control unit according to a second embodiment.

FIG. 7 is a perspective view illustrating a structure of an electronic control unit according to a third embodiment.

FIG. 8 is a cross-sectional view illustrating a structure of an electronic control unit according to a fourth embodiment.

FIG. 9 is a perspective view illustrating a structure of an electronic control unit studied by the present inventor.

FIG. 10 is a perspective view illustrating the structure of the electronic control unit studied by the present inventor after assembling.

FIG. 11 is a perspective view illustrating a structure of an electronic control unit according to a fifth embodiment.

DESCRIPTION OF EMBODIMENTS

Hereinafter, embodiments of the invention will be described based on the drawings. The same portions are generally denoted by the same reference numerals throughout the drawings for illustrating the embodiments, and repetitive descriptions thereof are omitted. An electronic control unit mounted in an automobile will be described below as an example although the invention is not particularly limited thereto.

First Embodiment

<Electronic Control Unit Capable of Reducing Abnormal Noise>

A structure of an electronic control unit capable of reducing abnormal noise studied by the present inventor will be explained first for easy understanding of the embodiments. FIG. 9 is a perspective view illustrating the structure of the electronic control unit ECU studied by the present inventor.

The electronic control unit ECU includes a shield case and a board accommodated therein. In FIG. 9, the shield case includes abase (case body) 2 and a cover 1. Aboard 3 is mounted in the base 2. FIG. 9 illustrates a state where the shield case is separated into the cover 1 and the base 2, that is, the state before the electronic control unit ECU is assembled. As described below with reference to FIG. 10, the cover 1 and the base 2 are fixed and engaged by screw fastening. The cover 1 and the base 2 are mounted in a fixed state (assembled state) in an automobile.

The cover 1 includes a ceiling portion (second surface) 6, screw fastened portions 4-1 and overlap portions 5. The ceiling portion 6 has a rectangular shape when viewed in a plan view, and the screw fastened portions 4-1 protrude from corners (four corners) of the rectangular ceiling portion 6 respectively. The overlap portions 5 are coupled to sides (four sides) of the ceiling portion 6 respectively. In FIG. 9, the ceiling portion 6 and the overlap portions 5 are coupled such that angles therebetween are right angles. A screw hole 4 is opened in each of the protruding screw fastened portions 4-1. In FIG. 9, 8 denotes length between centers of adjacent screw holes 4. Since protrusion of the screw fastened portions 4-1 is short, 8 can be regarded as length of a side of the ceiling portion 6. Similarly, 8 can be regarded as length of the overlap portions 5. In FIG. 9, 9 denotes width of the overlap portions 5, and 14 denotes a distance between the side of the ceiling portion 6 and the protruding screw fastened portions 4-1.

In order to avoid making the drawing complicated, reference numerals are attached only to a portion, and reference numerals of other portions are omitted. For example, although there are four overlap portions 5, only one overlap portion 5 is given reference numerals 8 and 9 denoting the length and the width. The length and the width of the other overlap portions 5 which are not given reference numerals are also 8 and 9. This also applies to reference numerals of other portions. Also in the drawings to be illustrated below, reference numerals are similarly given only to a portion.

The base 2 includes a bottom surface portion (first surface) 7 and side surfaces 11. Similarly to the ceiling portion 6, the bottom surface portion 7 has a rectangular shape when viewed in a plan view. The side surfaces 11 are coupled to sides (four sides) of the rectangular bottom surface portion 7 respectively. In FIG. 9, the side surfaces 11 are coupled to the bottom surface portion 7 such that angles between the bottom surface portion 7 and the side surfaces 11 are right angles. Screw fastened portions 12-1 are provided at corners (four corners) of the bottom surface portion 7 respectively. The screw fastened portions 12-1 provided at the four corners are coupled to the side surfaces 11 at the four corners respectively. A screw hole 12 is provided in each of the screw fastened portions 12-1. In FIG. 9, 10 denotes a connector unit. The connector unit 10 protrudes from the side surface 11. An opening is provided in a portion of the side surface 11 such that the connector unit 10 can protrude. Wirings connecting outside of the electronic control unit ECU and the board 3, that is, a wire harness, is connected to the connector unit 10. The wire harness includes a power supply wiring that supplies a power supply voltage to the board 3 and a signal wiring that transmits and receives signals between the outside and the board 3.

A plurality of semiconductor devices and electronic components are mounted on the board 3 and are connected by a wiring pattern formed on the board. In FIG. 9, only semiconductor devices IC1 to IC3 mounted on the board 3 are depicted. The board 3 is provided with screw holes and is fixed to the bottom surface portion 7 of the base 2 by screws 13.

As illustrated in FIG. 9, the length 8 of the overlap portion 5 is determined such that gaps are provided between the overlap portions 5 coupled to sides of the ceiling portion 6 orthogonal to each other. That is, the cover 1 has a structure in which the four corners of the rectangular ceiling portion 6 and a surface opposing the ceiling portion 6 are open. In contrast, in the base 2, the side surfaces 11 coupled to the sides of the bottom surface portion 7 respectively are coupled to each other at portions where the sides are orthogonal. Therefore, the base 2 has a structure in which a surface opposing the bottom surface portion 7 is open. In other words, the base 2 has a structure including the bottom surface portion 7, the side surfaces 11 coupled to the bottom surface portion 7 and an opening opposed to the bottom surface portion 7.

An area of the bottom surface portion 7 is larger than an area of the ceiling portion 6. During assembling of the electronic control unit ECU, the board 3 is mounted on the bottom surface portion 7 of the base 2 and is fixed with the screws 13, and then the cover 1 is inserted into the opening of the base 2. At this time, the cover 1 is inserted such that the screw holes 4 at the four corners of the cover 1 and the screw holes 12 at the four corners of the base 2 are aligned. Accordingly, openings between the overlap portions 5 orthogonal to each other in extending directions are aligned with the screw fastened portions 12-1 of the base 2. After the cover 1 is inserted into the base 2, screws 4-2 (FIG. 10) are fitted into the screw holes 12 through the screw holes 4, so that the base 2 and the cover 1 are fixed (engaged) with each other.

FIG. 10 is a perspective view (a perspective view after assembling) illustrating the structure of the electronic control unit ECU when the base 2 and the cover 1 are fixed. In FIG. 10, 4-2 denotes the screws fitted in the screw holes 12 through the screw holes 4. DD denotes gaps generated when the base 2 and the cover 1 are engaged with each other. That is, in the engaged state, the overlap portion 5 of the cover 1 and the side surface 11 of the base 2 are opposed to each other, and the distance 14 between the side of the ceiling portion 6 and the protruding screw fastened portion 4-1 exists, so that the gap DD corresponding to the distance 14 is generated between the overlap portion 5 and the side surface 11 that are opposed to each other.

When the cover 1 is engaged with the base 2, the width 9 of the overlap portion 5 is determined such that the overlap portion 5 does not contact the board 3, so that the cover 1 can be prevented from coming into contact with the base 2 and the board 3 at portions other than the portions fitted by the screws 4-2. As a result, even if deflection is generated in the cover 1 and/or the base 2 by vibration, the cover 1 can be prevented from colliding with the base 2 and the board 3, thereby preventing abnormal sound noise.

As illustrated in FIG. 10, after the cover 1 and the base 2 are assembled, the gap DD is generated between the side surface 11 of the base 2 and the overlap portion 5 of the cover 1. Emission noise generated in the board 3 leaks from the gap DD. In this case, in particular, a specific frequency depending on the size of the overlap portion 5 and the gap DD becomes the resonance frequency, and a resonance phenomenon occurs. That is, shielding performance is lowered for the emission noise at the resonance frequency. The resonance frequency at this time can be expressed by an equation (1). In the equation (1), $f_{lmn}$ represents the resonance frequency, W represents the length 8 of the overlap portion 5, L represents the width 9 of the overlap portion 5, H represents the gap DD between the overlap portion 5 and the side surface 11, and v is a propagation speed of an electromagnetic wave that passes through the gap DD. l, m, and n are variables, which are integers (0, 1, 2, . . . )

$$f_{lmn} = \frac{v}{2}\sqrt{\left(\frac{l}{W}\right)^2 + \left(\frac{m}{L}\right)^2 + \left(\frac{n}{H}\right)^2}$$ [Equation 1]

Since the shielding performance is lowered at the resonance frequency, the emission noise to the outside of the shield case becomes large at the resonance frequency. For example, in FIG. 9, when the screw fastened portions 4-1 and 12-1 are also provided even in a half position (W/2) of the length 8 (W in equation (1)), and when the cover 1 and the base 2 are connected by the screws 4-2, impedance of the overlap portion 5 at portions of the screws can be lowered, and the gap DD formed along the overlap portion 5 and the side surface 11 is divided at the half position (W/2). Accordingly, the resonance frequency can be increased compared with a case where fastening is not done by screws at the half position. However, in this case, cost increases since the number of screws increases and assembling time becomes longer.

The ceiling portion 6, the screw fastened portions 4-1 and the overlap portions 5 coupled to the ceiling portion 6 constituting the cover 1 are made of a metallic material. Similarly, the bottom surface portion 7, the side surfaces 11 and the screw fastened portions 12-1 constituting the base 2 are also made of a metallic material.

<Electronic Control Unit>

FIG. 1 is a perspective view illustrating a structure of an electronic control unit ECU according to a first embodiment. Since FIG. 1 is similar to FIG. 9, differences will be mainly described.

The metallic overlap portion 5 has a rectangular shape with sides 5-U, 5-D, 5-R, 5-L although the invention is not particularly limited thereto. Here, the side 5-U and the side 5-D are parallel to each other, and the side 5-R and the side 5-L are also parallel to each other. The side 5-U of the overlap portion 5 is coupled to a side of the ceiling portion 6 and a ridgeline LL is formed by the side 5-U and the side of the ceiling portion 6. In the first embodiment, a plurality of slits are provided in each of the four overlap portions 5 coupled to the sides (four sides) of the ceiling portion 6 respectively although the invention is not particularly limited thereto. The slits are formed by a notch extending from the side 5-D of the overlap portion 5 toward the side 5-U.

The cover 1 including the overlap portions 5 respectively provided with slits 15 is inserted into the base 2, so that the cover 1 and the base 2 are engaged by the screws 4-2 as described in FIGS. 9 and 10. A state where the cover 1 is engaged with the base 2, that is, a state of the shield case, will be described below when viewed from an AA direction and a BB direction shown in FIG. 1. FIGS. 3 and 4 are cross-sectional views illustrating the structure of the electronic control unit ECU according to the first embodiment. FIG. 3 illustrates a cross section when viewed from the AA direction in FIG. 1, and FIG. 4 illustrates a cross section when viewed from the BB direction in FIG. 1.

In FIG. 3, the side surface 11 opposed to the AA direction is omitted. In the figure, 11(AB) illustrated on a left side denotes the side surface 11 opposed to an AB direction illustrated in FIGS. 1 and 11 (BA) illustrated on a right side denotes the side surface 11 opposed to a BA direction. In the figure, 5(AB) denotes the overlap portion 5 opposed to the side surface 11 (AB), and 5 (BA) denotes the overlap portion 5 opposed to the side surface 11 (BA). As illustrated in FIG. 10, the overlap portions (5 (AB), 5 (BA)) opposed to the side surfaces (11(AB), 11(BA)) and the side surfaces (11(AB), 11(BA)) are spaced apart from each other, and the gaps DD exist. In the first embodiment, the screw fastened portion 12-1 extends between the bottom surface portion 7 and the opening opposed to the bottom surface portion 7.

In FIG. 3, three slits 15 are provided in the overlap portion 5. The three slits 15 have the same width SD and length SL2, and notches extend between the sides 5-R, 5-L so as to be parallel to the sides 5-R, 5-L although the invention is not particularly limited thereto. In addition, the notches do not reach the ridgeline LL. That is, a metallic region (length SL 1) exists between vertexes of the notches and the ridgeline LL. The overlap portion 5 depicted in FIG. 3 is an overlap portion opposed to the AA direction.

Intervals between the slits 15 provided in the overlap portion 5 are OV1 to OV4. In other words, in the overlap portion 5, lengths of the metallic overlap portion divided by the slits 15 in a horizontal direction are OV1 to OV4. The lengths OV1 to OV4 of regions of the overlap portion may be equal to each other or different from each other.

Next, a configuration when viewed from the BB direction in FIG. 1 will be described with reference to FIG. 4. Since FIG. 4 is similar to FIG. 3, differences from FIG. 3 will be described. Also in FIG. 4, the side surface 11 opposed to the BB direction is omitted similarly to FIG. 3. Unlike the case viewed from the AA direction, the connector unit 10 exists when viewed from the BB direction. Therefore, the overlap portion 5 opposed to the BB direction is provided with an opening (opening for a connector) 5-OP through which the connector unit 10 passes. In the first embodiment, a slit 15S extends in a direction from the opening 5-OP to the ridgeline LL between the opening 5-OP through which the connector unit 10 passes and the ridgeline LL. The length SL3 of the slit 15S is shorter than the length SL2 of the slit 15. In addition, a notch constituting the slit 15S does not reach the ridge line LL.

Even if the gap DD between the overlap portion 5 and the opposed to side surface 11 is the same, impedance of the overlap portion 5 at regions where the slits 15 are provided is higher than impedance of the overlap portion 5 at regions where the slits 15 are not provided. For example, when the slit 15 is provided at the half position (W/2) of the length 8 of the overlap portion 5, the impedance of the overlap portion 5 increases at a portion of the slit 15, and the gap DD is divided at the portion of the slit 15. Therefore, the resonance frequency can be increased compared to a case where the slit 15 is not provided. Therefore, the slit 15 is provided at a position where the impedance of the overlap portion 5 is low during the resonance frequency at which the emission noise is desired to be reduced, so that effect of reducing the emission noise can be enhanced.

FIG. 5 is a diagram showing an operation of the electronic control unit ECU according to the first embodiment. In the figure, an upper part schematically illustrates the structure of the electronic control unit ECU, and a lower part shows a change in the impedance of the overlap portion 5. The change in the impedance shows a case where the slit 15 is not provided in the overlap portion 5. A horizontal axis shows a position of the overlap portion 5, and a vertical axis shows a value of the impedance Z. When the emission noise at the resonance frequency determined by the size of the overlap portion 5 and the gap DD is emitted from the board 3, the change in the impedance similar to a wavelength of the resonance frequency occurs in the overlap portion 5. In this case, since the base 2 is coupled to a predetermined voltage Vs such as a ground voltage as illustrated in FIG. 1, the impedance is small in a position (the screw fastened portion) of the overlap portion 5 connected to the base 2 by the screw 4-2, and the impedance increases toward the half position (horizontal direction) of the overlap portion 5. In FIG. 5, for ease of illustration, only one resonance frequency is shown.

As described above, when the half position (W/2) of the overlap portion 5 is connected to the base 2 by a screw, the impedance of the overlap portion 5 in vicinity of the half position (W/2) can be lowered, so that the emission noise at the resonance frequency can be reduced by giving a large influence to the resonance frequency. The slit 15, when being provided at the half position (W/2) of the overlap portion 5, functions to increase the impedance in the vicinity of the half position (W/2). However, since the impedance in the vicinity of the half position (W/2) is originally high as shown in FIG. 5, the resonance frequency is hardly affected even if the slit 15 is provided.

Therefore, it is effective to provide the slit 15 at a position where the impedance is lower than the impedance at the half position (W/2), that is, at a position other than the half position (W/2) of the overlap portion 5. In a case where one slit 15 is provided at a position other than the half position (W/2), the overlap portion 5 is divided into two, and one of the two overlap portions divided has the length larger than W/2. Therefore, the resonance frequency determined by the overlap portion 5 having a length larger than W/2 has less change in frequency as compared with the case where the half position (W/2) is connected to the base 2 by a screw. Therefore, in order to change the resonance frequency of the overlap portion 5 in the same manner as in the case of using a screw, it is desirable to provide a plurality of slits 15 in the overlap portion 5. That is, in order to reduce the resonance similarly to the case of using a screw, it is effective to provide the plurality of slits 15 in one overlap portion 5.

In Non-Patent Document 1, the emission noise is regulated up to 960 MHz. Therefore, by setting the resonance frequency due to the overlap portion 5 to 960 MHz or more, the resonance does not affect the emission noise at the frequency within a specification range. Assuming that the variables are l=1 and m=n=0, the propagation velocity v is $3 \times 10^8$ [m/s] using the equation (1), the length W of the overlap portion 5 can be derived as 156 mm or less. Therefore, measures against the resonance can be taken by providing the slits 15 such that the overlap length 8 is divided by the slits 15 and the intervals OV1 to OV4 between the slits are up to 156 mm. Values of the variables l, m and n here represent values in the case of one resonance frequency. When two or more resonance frequencies are considered, the values of the variables are changed, and the slits 15 may be provided such that the intervals between the slits are shorter than the obtained length of the overlap portion.

FIG. 2 is a characteristic diagram showing noise emission characteristics. Here, a horizontal axis represents the frequency, and a vertical axis represents a level of the emission noise from the electronic control unit ECU. In the figure, a thin solid line 20 shows characteristics when the slits 15 are not provided in the overlap portion 5, and a thick solid line 21 shows characteristics when the slits 15 are provided in the overlap portion 5. Here, the slits 15 are arranged such that the intervals between the slits are up to 156 mm. As can be seen from FIG. 2, by providing the slits 15, the level of the emission noise can be reduced to be lower than that when the slits 15 are not provided. Particularly, in vicinity of the frequency of 960 MHz, the emission noise level can be reduced by 5 [dBuV/m] or more.

In the first embodiment, the slit 15 is configured by a notch extending from the side 5-D of the overlap portion 5 toward the ridgeline LL. For example, it is also conceivable to provide a rectangular opening as the slit between the side 5-D and the ridgeline LL. However, when such an opening is created as the slit 15, the overlap portion 5 is not divided between the opening and the ridgeline LL or between the opening and the side 5-D. Therefore, current paths are respectively formed on a ridgeline LL side and a side 5-D side, and the effect of reducing the emission noise at the resonance frequency decreases. In contrast, in the first embodiment, in the overlap portion 5, the side 5-D side is divided by the slits 15, and only the current path on the ridgeline LL side is formed, the effect of reducing the emission noise of the resonance frequency can be enhanced.

It is also conceivable to configure the slit 15 by a notch extending from the side 5-D to the ceiling portion 6 across the ridgeline LL. Accordingly, the current path can be further reduced, which is desirable from a viewpoint of reducing the emission noise. However, the notch is formed up to the ceiling portion 6, and deflection of the cover 1 due to vibration is likely to occur, which is undesirable from a viewpoint of generating abnormal noise. Therefore, in the first embodiment, the slits 15 do not cross the ridgeline LL.

In the first embodiment, as illustrated in FIG. 4, the opening 5-OP through which the connector unit 10 passes is provided in the overlap portion 5, and the slit 15S is also provided in the opening 5-OP. Accordingly, the emission noise at the resonance frequency can be reduced also in the connector unit 10.

The first embodiment shows an example of supplying the predetermined voltage Vs to the base 2. However, in order to perform shielding, the predetermined voltage Vs may be supplied to the base 2 and the cover 1 at a high frequency. Therefore, when the emission noise at the high frequency is transmitted to the base 2 and the cover 1, the predetermined voltage Vs may be connected to the base 2 via, for example, a capacitive element such that the predetermined voltage Vs is supplied to the base 2. Here, it is indicated that the predetermined voltage Vs is coupled to the base 2 in cases including both supply of the predetermined voltage Vs and supply of the predetermined voltage Vs at the high frequency.

The ceiling portion 6, the screw fastened portions 4-1 and the overlap portions 5 are made of the metallic material. Therefore, the ceiling portion 6, the screw fastened portions 4-1 and the overlap portions 5 may be integrally formed by, for example, pressing or casting a metal material. Similarly, the bottom surface portion 7, the screw fastened portions 12-1 and the side surfaces 11 are also made of the metallic material and may be thus integrally formed by pressing or casting a metal material.

In the first embodiment, the base 2 can be regarded as including the bottom surface portion 7, the side surfaces 11 coupled to the sides of the bottom surface portion 7, and an opening opposed to the bottom surface portion 7. In this case, the cover 1 is inserted from the opening of the base 2 and is engaged with the base 2 such that the side surfaces 11 and the overlap portions 5 are opposed to each other while being spaced apart. The side surfaces 11 and the overlap portions 5 are spaced apart from each other, and the gap DD exists. Since the area of the bottom surface portion 7 is larger than the area of the ceiling portion 6, the cover 1 covers at least a part of the bottom surface portion 7 of the base 2 when the cover 1 and the base 2 are engaged. The ceiling portion 6 of the cover 1 is opposed to at least a part of the bottom surface portion 7 of the base 2.

The area of the slit 15 (notch), that is, a product of the length SL2 (or SL3) and the width SD (FIGS. 3 and 4) may be determined within a range in which the amount of the emission noise from the board 3 leaking through the slit 15 does not excessively increase. However, the length SL2 is determined within a range not to cross the ridgeline LL.

In addition, since the cover 1 is inserted from the opening of the base 2, the slits 15 provided in the overlap portions 5 are arranged inside the base 2. That is, the slits 15 cannot be seen from outside of the base 2. Therefore, since the emission noise inside the cover is not emitted directly to the outside of the base 2 from the width SD of the slits 15, it is effective to reduce the emission noise.

Second Embodiment

FIG. 6 is a perspective view illustrating a structure of an electronic control unit ECU according to a second embodiment. Since FIG. 6 is similar to FIG. 1, differences will be mainly described. The electronic control unit according to the first embodiment is provided with the connector unit 10 through which the wire harness passes. In contrast, the connector unit 10 is not provided in the second embodiment. Instead of the connector unit 10, a plurality of divided connector units 30 are provided in the side surface 11.

The divided connector units 30 are provided at positions opposed to the slits 15 of the opposed to overlap portion 5 in the side surface 11. The divided connector units 30 are configured by rectangular openings formed in the side surface 11 although the invention is not particularly limited thereto. That is, the divided connector units 30 are configured by the rectangular openings through which the side surface 11 can be passed. Accordingly, the openings of the divided connector units 30 and notch portions of the slits 15 overlap each other when the cover 1 and the base 2 are engaged. That is, when viewed from the AA direction in the assembled state, the divided connector units 30 can be viewed from outside of the electronic control unit ECU via the divided connector units 30 and the slits 15 overlapped with each other.

A wire harness is connected to the overlapped divided connector units 30 and connects the board 3 and the outside of the electronic control unit ECU. Accordingly, the board 3 and the outside of the electronic control unit ECU can be connected by the wire harness without the connector unit 10.

The amount of emission noise from the board 3 to the outside of the electronic control unit ECU is proportional to the area of the openings. Therefore, when the connector unit 10 is large, the amount of the emission noise to the outside is large. By reducing the area of the opening of the connector unit 10, the amount of the emission noise can be reduced. However, since the area of the opening of the connector unit 10 is determined by the number of the wire harness, it is difficult to reduce the area of the opening of the connector unit 10.

In the second embodiment, instead of the connector unit 10, the plurality of divided connector units 30 are provided in the side surface 11. In this embodiment, wire harnesses are divided into a plurality of parts, and the divided wire harnesses are arranged so as to pass through the divided connector units 30 respectively. Accordingly, it possible to reduce the amount of emission noise through the connector units and to reduce the emission noise at the resonance frequency.

The number of divided connector units 30 provided in one side surface 11 may be the same as or different from the number of the slits 15 provided in one opposed to overlap portion 5.

The plurality of divided connector units 30 may be arranged at an equal interval or may not be equally spaced. For example, as described in the first embodiment, the intervals between the slits 15 are set to up to 156 mm. In accordance with this, the intervals between the divided connector units 30 may be set to up to 156 mm.

Third Embodiment

FIG. 7 is a perspective view illustrating a structure of an electronic control unit ECU according to a third embodiment. FIG. 7 is similar to FIG. 1. In the first embodiment, the slits 15 are provided in each of the four overlap portions 5 coupled to the four sides of the ceiling portion 6. In contrast, in the third embodiment, the slits 15 are provided only in a predetermined overlap portion 5 among the four overlap portions 5.

In FIG. 1, IC1 to IC3 are clearly indicated as semiconductor devices mounted on the board 3. As described in the first embodiment, the electronic components are mounted on the board 3 in addition to the semiconductor devices, and the wiring pattern is formed on the board 3. In FIG. 7, a semiconductor device IC4 and a wiring pattern 40 are depicted instead of the semiconductor devices IC2, IC3. The wiring pattern 40 is a clock wiring pattern that connects the semiconductor devices IC1, IC4 and supplies, for example, clock signals from the semiconductor device IC4 to the semiconductor device IC1.

In FIG. 7, the clock wiring pattern 40 is formed on the board 3 so as to extend in a predetermined first direction. The clock signals transmitted by the clock wiring pattern 40 periodically change in voltage. A waveform of the changing voltage is, for example, a rectangular wave. Therefore, the clock wiring pattern 40 generates emission noise including broadband frequency components.

In the third embodiment, the slits 15 are provided in an overlap portion 5 in which the sides 5-U, 5-D extend in the same direction as the first direction. That is, the slits 15 are provided in the overlap portion 5 having a longitudinal direction (sides 5-U, 5-D) substantially parallel to the clock wiring pattern 40. In contrast, the slits 15 are not provided in an overlap portion 5 in which the sides 5-U, 5-D extend in a second direction perpendicular to the first direction (by 90°), that is, the overlap portion 5 having a longitudinal direction (sides 5-U, 5-D) substantially parallel to the second direction. In FIG. 7, the overlap portions 5 opposed to the AA direction and the BB direction are the overlap portions having the longitudinal direction extending in the first direction, and the overlap portions 5 opposed to the AB direction and the BA direction are the overlap portions having the longitudinal direction extending in the second direction.

Therefore, as illustrated in FIG. 7, the slits 15 are provided in the overlap portion 5 opposed to the AA direction, and are not provided in the overlap portion 5 opposed to the AB direction. Although not illustrated in FIG. 7, the slits 15 are not provided in the overlap portion 5 opposed to the BA direction either. Although not illustrated in FIG. 7, the slits 15 are not provided in the overlap portion 5 opposed to the BB direction either. That is, among the four overlap portions 5, three slits 15 are provided only in the overlap portion 5 opposed to the AA direction.

Assuming a case where the emission noise from a linear pattern such as the clock wiring pattern 40 is received by an antenna, the electric field strength when received by the antenna arranged substantially in parallel with the clock wiring pattern 40 is higher than the electric field strength when received by the antenna arranged in a 90° direction (second direction) with respect to the clock wiring pattern 40.

Therefore, leakage to outside due to resonance of the overlap portion 5 can be reduced by arranging the slits 15 in the overlap portion 5 arranged substantially in parallel with the clock wiring pattern 40. Even if the slits 15 are not arranged in the overlap portion 5 having a 90° inclination with respect to the clock wiring pattern 40, the electric field strength from the clock wiring pattern 40 is weak, so that the resonance of the overlap portion 5 is weakened and the leakage of emission noise to the outside is small.

Accordingly, it is not necessary to provide slits in the overlap portion 5 arranged in the 90° direction with respect to the clock wiring pattern 40, so that the cost can be reduced. Here, although an example of providing the slits 15 only in the overlap portion 5 opposed to the AA direction has been described, the slits 15 may also be provided similarly in the overlap portion 5 opposed to the BB direction.

In addition to the clock wiring pattern 40, a signal wiring pattern of transmitting transmission and reception signals is also provided on the board 3. Since the emission noise also occurs in the signal wiring pattern, the slits 15 are provided in the overlap portion 5 substantially parallel to the signal wiring pattern, and the slits 15 may not be provided in the overlap portion 5 arranged in the 90° direction.

However, as described above, the emission noise emitted from the clock wiring pattern includes the wideband frequency components, and is possible to become a dominant emission noise source since the emission noise is a continuous wave. Therefore, when measures are taken against the influence due to the resonance of the overlap portion 5, it is considered that the clock wiring pattern 40 is effective as a type of wiring pattern to reduce the emission noise.

Fourth Embodiment

FIG. 8 is a schematic cross-sectional view illustrating a structure of an electronic control unit ECU according to a fourth embodiment.

In the fourth embodiment, the bottom surface portion 7 of the base 2 includes protruding portions 50, 51 protruding to inside of a shield case, and fins 54 on outside of the shield case. The board 3 is fixed by screws 52 at apex portions of the protruding portions 51. The semiconductor devices IC1, IC2 are mounted on inside of the board 3, and a heat dissipation sheet (gel) 53 is sandwiched between each of the semiconductor devices IC1, IC2 and the protruding portion 50. The overlap portion 5 is schematically indicated by alternate long and short dashed lines, and the slits 15 are also provided in the fourth embodiment similarly to the first to third embodiments.

In the fourth embodiment, the fin 54 functions as a heat dissipation plate. Therefore, it is possible to provide an electronic control unit ECU having high heat dissipation efficiency.

Fifth Embodiment

FIG. 11 is a view illustrating a structure of an electronic control unit ECU according to a fifth embodiment. FIG. 11 is similar to FIG. 7 according to the third embodiment. Therefore, differences will be mainly described.

The fifth embodiment is different from the third embodiment in that a base 101 is inserted into a cover 100. Therefore, slits 103 provided in the overlap portion 5 are provided in the base 101. As in the fourth embodiment, the base 101 includes the fins 54 that dissipate heat at the bottom of the base 101. In FIG. 11, the slits 103 are also provided in an overlap portion opposed to the BB direction.

In the third embodiment, the cover is inserted into the base, but in the fifth embodiment, the base is inserted into the cover. Since the slits are provided in the overlap portion of the base, it is effective to reduce noise emitted directly to outside of the cover.

The emission noise that passes through the cover 100 and the base 101 can be regarded as the emission noise that passes through a waveguide. Generally, emission noise attenuates as the length of the waveguide is larger. In other words, emission noise attenuates as the width 104 of the overlap portion 5 is larger. The width 104 of the overlap portion 5 can be larger than the width 9 of the overlap portion 5 illustrated in FIG. 7 by the length of a fin height 105 by providing the fins 54 at both ends of the base. Therefore, in the present embodiment, it is possible to provide an electronic control unit ECU that reduces the emission noise while dissipating heat.

Although the invention has been described in detail based on the embodiments, the present invention is not limited to the above-described embodiments, and various modifications can be made without departing from the scope of the invention.

For example, when the resonance occurs at a predetermined frequency of 960 MHz or less so that the width 9 of the overlap portion 5 is 156 mm or more, the slits 15 may be provided so as to be parallel to the sides of the ceiling portion 6 of the cover 1.

REFERENCE SIGN LIST

1 cover
2 base
3 printed circuit board
5 overlap portion
6 ceiling portion
7 bottom surface portion
8 length of overlap portion
9 width of overlap portion
10 connector unit
13 side surface
15, 15S slit
ECU Electronic Control Unit
IC1 to IC4 semiconductor device

The invention claimed is:

1. An electronic control unit comprising:
a case body that has a first surface on which a board is mounted and an opening opposed to the first surface;
a cover that covers at least a part of the first surface and is engaged with the case body; and
a connector unit,
wherein the cover includes an overlapping portion that is spaced apart from and opposed to a side surface of the case body, and the overlapping portion includes a slit,
wherein the connector unit passes through the side surface of the case body, and
wherein the connector unit is arranged in a position opposed to a slit included in the overlapping portion opposed to the side surface of the case body.

2. The electronic control unit according to claim 1, wherein
the case body includes a plurality of side surfaces along sides of the first surface, respectively, and
the cover includes a plurality of overlapping portions opposed to the plurality of side surfaces, and at least one of the plurality of overlapping portions includes a plurality of slits.

3. The electronic control unit according to claim 2, wherein
in the overlapping portions, an interval between adjacent slits is 156 mm or less.

4. The electronic control unit according to claim 3, wherein
the case body includes a clock wiring pattern that extends in a first direction, and
one overlapping portion of the plurality of overlapping portions that extends in the first direction includes a slit.

5. An electronic control unit comprising:
a board on which a semiconductor device is mounted;
a metallic case body that includes a first surface on which the board is mounted, a plurality of side surfaces provided along sides of the first surface, respectively, and an opening opposed to the first surface; and
a metallic cover that includes a second surface opposed to at least a part of the first surface, and a plurality of overlapping portions provided along sides of the second surface respectively,
wherein the cover is engaged with the case body so that the second surface is opposed to the first surface and the plurality of overlapping portions are opposed to and spaced apart from the plurality of side surfaces, and at least one overlapping portion of the plurality of overlapping portions is provided with at least one slit,
wherein the overlapping portion includes an opening for a connector, and is provided with the slit extending from the opening for the connector toward a ridgeline between the overlapping portion and the second surface, and
wherein the at least one slit is a notch that extends from one side of the overlapping portion toward the ridgeline between the second surface and another side of the overlapping portion parallel to the one side, and wherein the notch does not reach the ridgeline.

6. The electronic control unit according to claim 5, wherein
the at least one slit includes a plurality of slits.

7. The electronic control unit according to claim 6, wherein
the first surface and the second surface each have a rectangular shape, and
the cover and the case body are fixed to each other by screws at each corner of the rectangular shaped first surface.

8. The electronic control unit according to claim 7, wherein
the case body is coupled to a predetermined voltage.

9. The electronic control unit according to claim 8, wherein
a clock wiring pattern that extends in parallel with the overlapping portion including the slit is formed on the board.

* * * * *